United States Patent [19]
Ko et al.

[11] Patent Number: 5,827,396
[45] Date of Patent: Oct. 27, 1998

[54] DEVICE FOR TURNING A WAFER DURING A WET ETCHING PROCESS

[75] Inventors: Se-jong Ko, Suwon; Pyeong-sik Jeon, Cheonan; Young-hwan Yun, Seoul; Sang-young Moon, Ansan, all of Rep. of Korea

[73] Assignee: Samsung Electronics Co., Ltd., Suwon, Rep. of Korea

[21] Appl. No.: 773,059

[22] Filed: Dec. 24, 1996

[30] Foreign Application Priority Data

Dec. 27, 1995 [KR] Rep. of Korea ................... 1995-59501

[51] Int. Cl.⁶ ............................... C23F 1/00; C03C 25/06
[52] U.S. Cl. ............................................. 156/345; 216/91
[58] Field of Search ................. 156/345; 216/91

[56] References Cited

U.S. PATENT DOCUMENTS 3,766,046  10/1973  Flint ........................................ 204/297
4,376,482  3/1983   Wheeler et al. ........................ 198/394
5,046,909  9/1991   Murdoch .................................. 414/225

FOREIGN PATENT DOCUMENTS 8107100  4/1996  Japan .

*Primary Examiner*—Michael P. Woodward
*Assistant Examiner*—Brenda G. Brumback
*Attorney, Agent, or Firm*—Jones & Volentine, L.L.P.

[57] ABSTRACT

A wet etching device used in manufacturing a semiconductor device includes a power source, a transmission device for transmitting power from the power source, and a roller for reversing top and bottom positions of a wafer placed in a processing bath using power from the power source transmitted by the transmission device. Here, the initial top and bottom positions of the wafer during loading are reversed before unloading. Accordingly, the entire surface of the wafer spends an equal amount of time in the processing bath containing a chemical solution and can thus be etched uniformly.

6 Claims, 3 Drawing Sheets

DEVICE FOR TURNING A WAFER DURING A WET ETCHING PROCESS

BACKGROUND OF THE INVENTION

1. Field of the Invention

The present invention relates to a device for a wet etching process using a chemical solution in a manufacturing process of a semiconductor device, and more particularly, to a wet etching device having a unit that changes the top and bottom positions of a wafer before completion of the wet etching process in order to obtain uniform reaction results regardless of the position on a wafer surface.

2. Description of the Related Art

In order to increase the number of chips obtained from one silicon wafer, efforts have been made to reduce chip size or increase the diameter of a wafer. In particular, the diameter of the wafer has become larger, increasing in diameter at a rate of 1 inch (25 mm) every four years. It is anticipated that in the near future, the standard diameter of a silicon wafer will switch from the current 8 inches (200 mm) to 12 inches (300 mm).

However, there are certain problems associated with enlarging the wafer diameter, such as thermal plastic deformation and non-uniformity of the wafer surface. Accordingly, in order to compensate for such problems, heating processes must be carried out at low temperatures and the manipulation of processing apparatus must be changed.

When an enlarged wafer is wet etched using a chemical solution, the etched thickness differs at different positions on the wafer. As illustrated in FIG. 1, a carrier 16, having flat-zone-aligned wafers 18 loaded therein, is submerged into a processing bath 10 having a chemical solution 12. The chemical solution 12 is selected according to the object of the process. The loaded carrier is placed or settled on a wafer guide 14 and then the wet etching process is carried out. After the chemical reactions are complete the carrier 16 is unloaded.

As shown in FIG. 1, when a wafer is loaded, the flat zone region, or bottom region A, of the wafer enters the processing bath before top region B. When the wafer is unloaded, the top region B leaves the processing bath before the bottom region A. That is, the bottom region A is in contact with the chemical solution for a longer period of time than the top region B. As a result, the bottom region A is etched more than the top region B, and a uniformly etched wafer cannot be obtained.

Table 1 shows the etched thickness of five 8-inch wafers which react on a buffered oxide etchant (B.O.E). The bottom and top regions refer to A and B of FIG. 1, respectively. Table 1 shows that the difference in etched thickness between bottom region A and top region B is approximately 97 Å/min. It can be inferred that the difference in etched thickness will be larger for larger diameter wafers.

TABLE 1

Etched Thickness of Top and Bottom Wafer Regions

| WAFER NUMBER | ETCHED THICKNESS (Å/min) OF TOP REGION B | ETCHED THICKESS (Å/min) OF BOTTOM REGION A |
|---|---|---|
| 1 | 2725 | 2825 |
| 2 | 2710 | 2800 |
| 3 | 2730 | 2810 |
| 4 | 2730 | 2850 |
| 5 | 2725 | 2820 |
| AVERAGE | 2724 | 2821 |

SUMMARY OF THE INVENTION

Accordingly, it is an object of the present invention to provide a wet etching device whereby the portion of the wafer which is immersed in a chemical solution first is also removed first therefrom, i.e., the portion which goes in first comes out first, thereby uniformly etching the entire surface of a wafer.

To accomplish these and other objects, the present invention provides a wet etching device comprising: a power source, a transmission means for transmitting power from the power source, and a roller for reversing top and bottom positions of a wafer placed in a processing bath using the power from the power source transmitted by the transmission means.

It is preferable that the roller is supported by a supporter such that the roller can contact the circumference of the wafer that is partly exposed from the carrier. It is also preferable that the wet etching device further comprises a sensor for detecting a flat zone that is aligned in a line by the roller. Also, it is preferable to form the roller and supporter by using materials that are non-corrosive to a chemical solution, more preferably the non-corrosive material is TEFLON, which includes tetrafluoroethylene fluorocarbon polymers and fluorinated ethylene-propylene resins.

Accordingly, since the wafer is repositioned after being loaded into the processing bath so that the initial position is reversed when unloaded, the etched thickness of the entire surface of the wafer is uniform.

BRIEF DESCRIPTION OF THE DRAWINGS

The above objects and advantages of the present invention will become more apparent by describing a preferred embodiment thereof in detail with reference to the attached drawings in which.

DETAILED DESCRIPTION OF THE INVENTION

Figure 1:
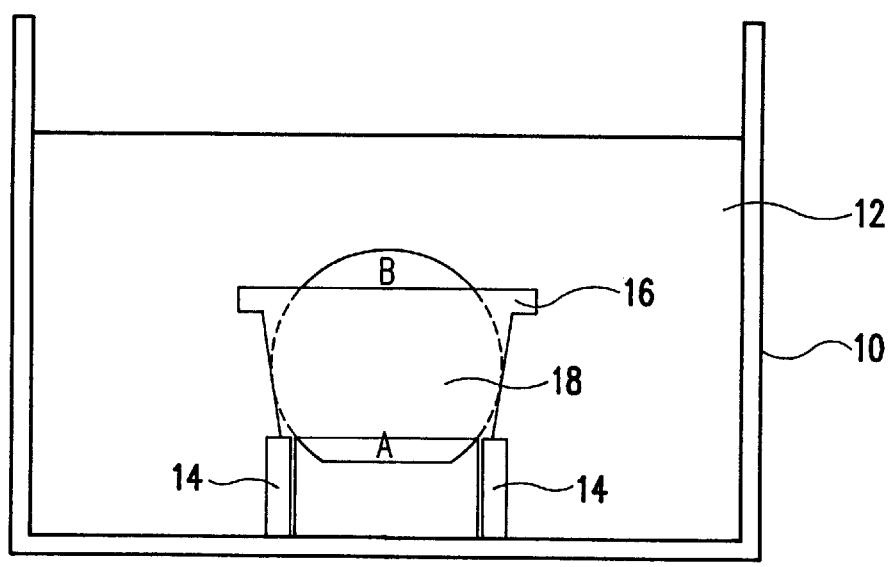
FIG. 1 is a sectional view showing a conventional wet etching device.
Figure 2:
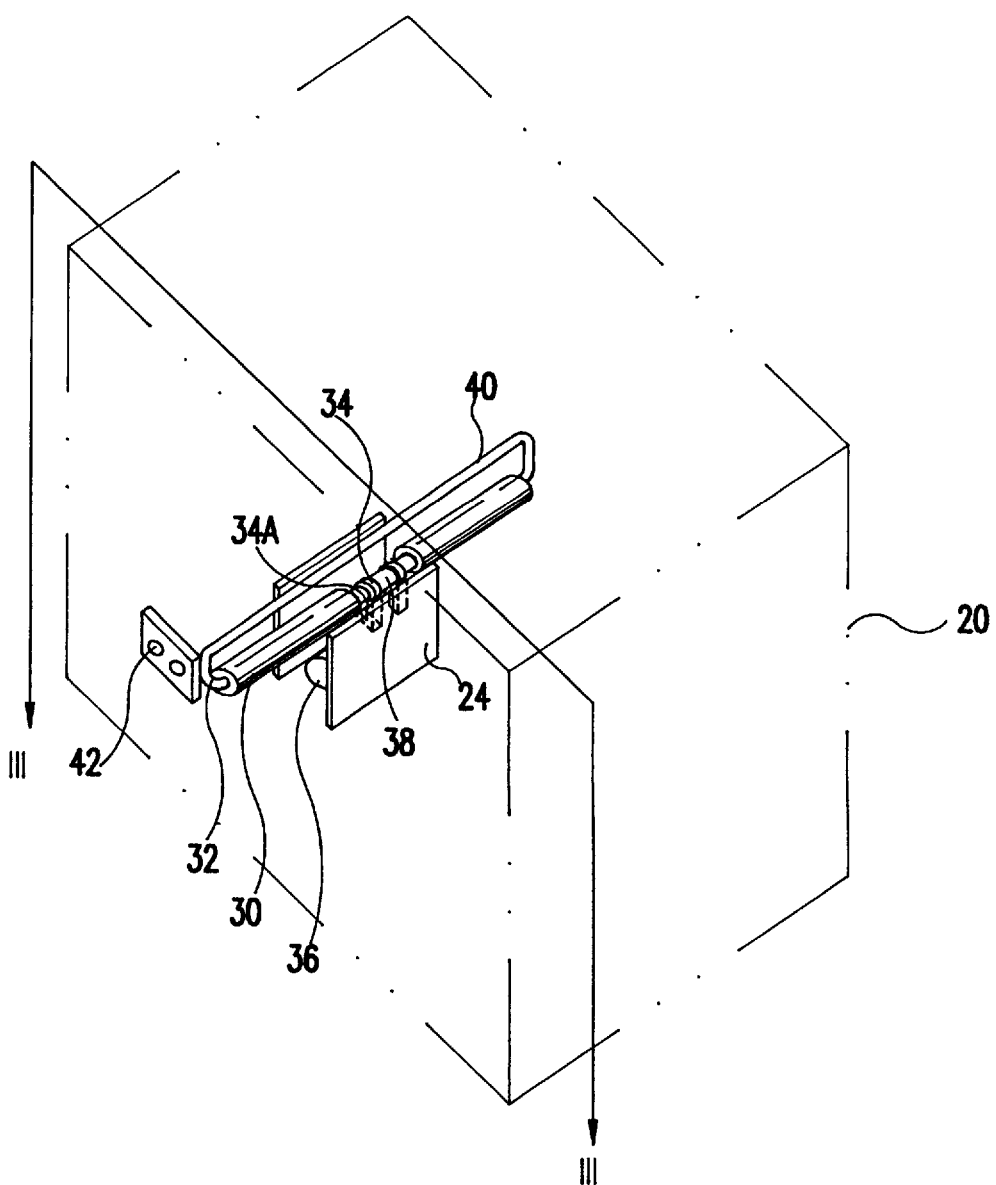
FIG. 2 is a perspective view of a wet etching device according to an embodiment of the present invention.

Referring to FIG. 2, a means for repositioning wafers, for example, roller 30, is supported by a supporter 34. The roller 30 can rotate the wafers 28 loaded in the processing bath 20 180° before the wafers 28 are unloaded. The supporter 34 is high enough to allow the roller 30 to contact the circumference of the wafer 28 (see FIG. 3) exposed from a carrier 26 (see FIG. 3) that is placed on a wafer guide 24. The roller 30 rotates using the power from a power source 36 transmitted by a power transmission means 38, for example, a power transmission belt. A lift 40 is connected to both ends of the roller 30 and moves the roller 30 up and down along a groove 34A in the supporter 34. A sensor 42 located outside the processing bath detects whether flat zones of the wafers are arrayed in a line or not by the roller 30. While the power source 36 is placed inside the processing bath according to the embodiment shown in FIG. 2, the power source 36 can also be placed outside of the processing bath.

Figure 3:
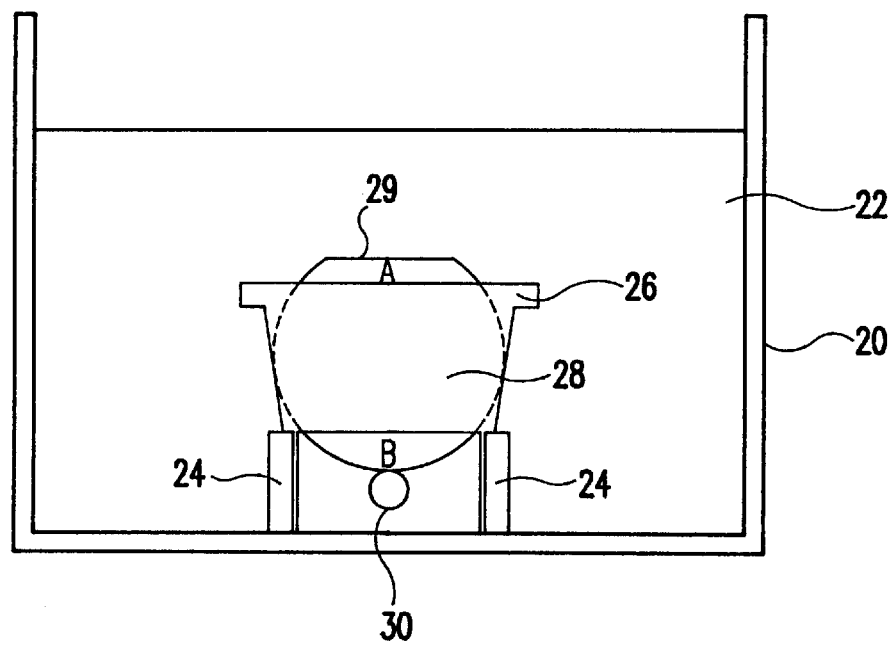
FIGS. 3 and 4 are sectional views of the wet etching device of FIG. 2 taken along the line III—III.
Figure 4:
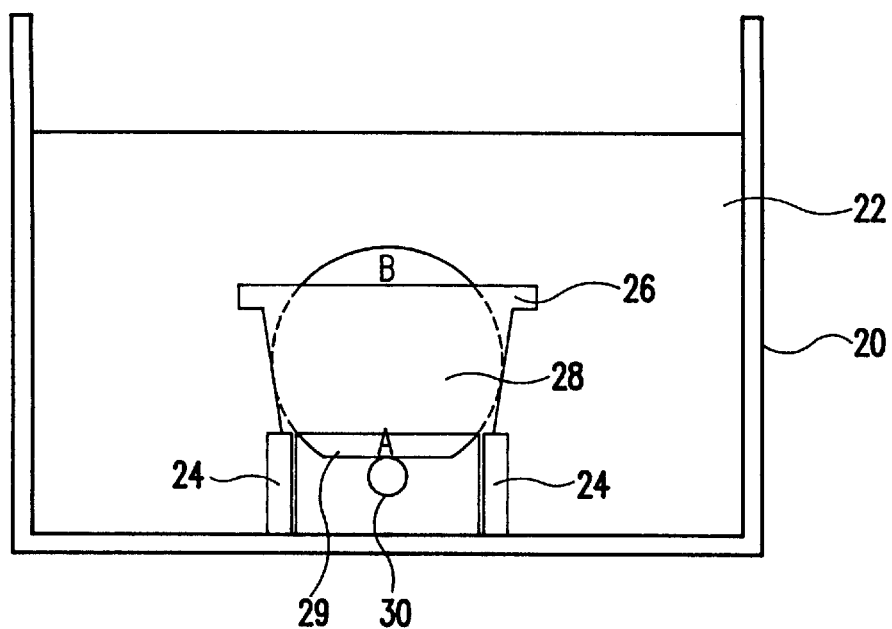

The operation of the wet etching device of the present invention is illustrated by referring to FIGS. 3 and 4. The same reference numerals refer to the same or like elements in FIGS. 2–4.

FIG. 3 is a sectional view taken along the line III—III of FIG. 2 shortly after a carrier 26 is loaded into a processing bath 20. Wafers 28 are loaded in a carrier 26, wherein the flat zones 29 (region A) of the wafers 28 extend above and are aligned with the top of the carrier 26. The carrier 26 is loaded in the processing bath 20 having a chemical solution 22 appropriate for the process, and the carrier 26 is placed on a wafer guide 24. After the carrier 26 is settled on the wafer guide 24, the roller 30, lifted along the groove 34A of the supporter 34 by the lift 40, contacts the edges of the wafers 28 (region B) opposite the flat zones 29.

FIG. 4 is a sectional view of a wet etching device just before the wafer 28 is unloaded. The power source 36 of FIG. 2 is energized before the reactions in the processing bath 20 are completed. The power transmitted through the power transmission means 38 of FIG. 2 rotates the roller 30. The wafers 28 also rotate with the rotation of the roller 30. When all of the flat zones 29 are in contact with the roller 30, the wafers 28 do not rotate any further, since the rotary power is not efficiently transmitted to the wafers 28, and the roller 30 merely idles. While the roller 30 is idling, the roller moves down along the groove 34A of the supporter 34 by the lift 40. Then, a sensor 42 detects whether the flat zones 29 have been completely aligned or not. That is, the flat zones 29 which were at the top portion of the carrier 26 move to the bottom of the carrier 26 just prior to the wafers 28 being unloaded.

According to the present invention, while the wafer is immersed in the chemical solution, the positions of the top and bottom portions of the wafer are reversed, so that reaction time over the entire surfaces of the wafers will be equal. Accordingly, etching uniformity can be realized on the whole surface of the wafer.

Although preferred embodiments of the present invention have been described in detail hereinabove, it should be clearly understood that many variations and/or modifications of the basic inventive concepts herein taught, which may appear to those skilled in the art, will still fall within the spirit and scope of the present invention as defined in the appended claims and their equivalents.

What is claimed is:

1. A wet etching device for manufacturing a semiconductor device, comprising:

a processing bath;

a power source;

a transmission means for transmitting power from said power source;

a wafer carrier housing a plurality of wafers, which wafers are positioned parallel to one another and are oriented vertically in the carrier in a first position where a flattened edge of the circumference of each wafer extends above a top of the wafer carrier;

a wafer guide disposed in the processing bath for receiving the wafer carrier; and a roller horizontally disposed below the wafer carrier and within the wafer guide, for contacting the circumferential edges of the wafers, which edges extend through a bottom of the wafer carrier, and for rotating the wafers from the first position to a second position where the flattened edge of the circumference of each wafer contacts the roller, the roller being driven by the power generated by the power source and transmitted to the roller by the transmission means.

2. A wet etching device according to claim 1, wherein the roller is supported by a supporter for contacting the circumferential edges of the wafers.

3. A wet etching device according to claim 1, further comprising a sensor disposed in the processing bath for detecting the alignment of the flattened edge of the circumference of each wafer with the bottom of the wafer carrier.

4. A wet etching device according to claim 2, wherein the roller and supporter are formed of a material that is non-corroding in a chemical solution.

5. A wet etching device according to claim 2, wherein the transmission means is a power transmission belt.

6. A wet etching device according to claim 2, further comprising a lifting means, attached to the ends of the roller, for moving the roller up and down along a groove in the supporter to allow the roller to selectively contact the circumferential edge of each wafer.

* * * * *